(12) United States Patent
Zhang et al.

(10) Patent No.: US 10,148,293 B2
(45) Date of Patent: Dec. 4, 2018

(54) INCREMENTAL LLR GENERATION FOR FLASH MEMORIES

(71) Applicant: SK hynix Inc., Gyeonggi-do OT (KR)

(72) Inventors: Fan Zhang, Fremont, CA (US); David J. Pignatelli, Saratoga, CA (US); June Lee, Sunnyvale, CA (US)

(73) Assignee: SK Hynix Inc., Gyeonggi-do (KR)

( * ) Notice: Subject to any disclaimer, the term of this patent is extended or adjusted under 35 U.S.C. 154(b) by 102 days.

(21) Appl. No.: 15/072,009

(22) Filed: Mar. 16, 2016

(65) Prior Publication Data

US 2016/0277041 A1 Sep. 22, 2016

Related U.S. Application Data

(60) Provisional application No. 62/134,369, filed on Mar. 17, 2015.

(51) Int. Cl.
| | | |
|---|---|---|
| *H03M 13/00* | (2006.01) | |
| *G06F 11/00* | (2006.01) | |
| *H03M 13/45* | (2006.01) | |
| *G06F 11/10* | (2006.01) | |
| *H03M 13/37* | (2006.01) | |
| *H03M 13/11* | (2006.01) | |
| *H03M 13/15* | (2006.01) | |
| *H03M 13/25* | (2006.01) | |
| *H03M 13/29* | (2006.01) | |

(52) U.S. Cl.
CPC ......... *H03M 13/45* (2013.01); *G06F 11/1004* (2013.01); *G06F 11/1012* (2013.01); *H03M 13/3723* (2013.01); *H03M 13/6325* (2013.01); *H03M 13/1111* (2013.01); *H03M 13/152* (2013.01); *H03M 13/1515* (2013.01); *H03M 13/251* (2013.01); *H03M 13/256* (2013.01); *H03M 13/2957* (2013.01); *H03M 13/2963* (2013.01)

(58) Field of Classification Search
CPC ............ H03M 13/45; H03M 13/3723; H03M 13/6325; H03M 13/1111; H03M 13/1515; H03M 13/251; H03M 13/256; H03M 13/2957; H03M 13/2963; H03M 13/1108; H03M 13/1125; H03M 13/1105; G06F 11/1004; G06F 11/1012; G06F 11/1048; G06F 11/1068; G06F 11/1072
USPC ......... 714/773, 780, 794, 795; 375/341, 340
See application file for complete search history.

(56) References Cited

U.S. PATENT DOCUMENTS

| | | | | |
|---|---|---|---|---|
| 2015/0113354 A1* | 4/2015 | Wu | ..................... | G06F 11/1068 714/764 |
| 2015/0149871 A1* | 5/2015 | Chen | .................. | G06F 11/1068 714/773 |
| 2015/0243363 A1* | 8/2015 | Wu | ..................... | G11C 11/5642 365/185.18 |

(Continued)

*Primary Examiner* — Christine T. Tu
(74) *Attorney, Agent, or Firm* — IP & T Group LLP

(57) ABSTRACT

Methods for decoding information stored on a memory may include performing a hard read at an initial threshold and determining a first distribution percentage, performing a hard read at a subsequent threshold and determining a second distribution percentage, generating a log-likelihood ratio (LLR) based on the hard reads performed at the initial and subsequent thresholds, and based on the first and second distribution percentages, and soft decoding the information based on the generated LLR.

16 Claims, 7 Drawing Sheets

(56) References Cited

U.S. PATENT DOCUMENTS

2017/0262334 A1* 9/2017 Uchikawa .......... G06F 11/1068

* cited by examiner

INCREMENTAL LLR GENERATION FOR FLASH MEMORIES

CROSS-REFERENCE TO RELATED APPLICATIONS

This application claims the benefit of U.S. Provisional Application No. 62/134,369 filed Mar. 17, 2015, the entire contents of which are incorporated herein by reference.

BACKGROUND

1. Field

Exemplary embodiments of the present disclosure relate to a memory controller and an operating method thereof.

2. Description of the Related Art

Semiconductor memory devices are generally classified into volatile memory devices, such as a dynamic random access memory (DRAM) and a static RAM (SRAM), and nonvolatile memory devices, such as a read only memory (ROM), a mask ROM (MROM), a programmable ROM (PROM), an erasable PROM (EPROM), an electrically EPROM (EEPROM), a ferromagnetic RAM (FRAM), a phase change RAM (PRAM), a magnetoresistive RAM (MRAM), a resistive RAM (RRAM) and a flash memory.

Volatile memory devices lose their stored data when their power supply is interrupted, whereas nonvolatile memory devices retain their data even without a constant source of power. Flash memory devices are widely used as a storage medium in computer systems because of their high program speed, low power consumption and large data storage capacity.

In nonvolatile memory devices, especially in flash memory devices, data states storable in each memory cell are determined based on the number of bits stored in the memory cell. A memory cell storing 1-bit data per cell is called a single-bit cell or a single-level cell (SLC). A memory cell storing multiple bits of data (i.e., 2 or more bits data) per cell is called a multi-bit cell, a multi-level cell (MLC) or a multi-state cell. The multi-bit cell is advantageous because it allows more data to be stored in a limited area. However, as the number of bits programmed in each memory cell increases, the reliability decreases and the read failure rate increases. What is therefore required is a scheme for precisely determining optimal read voltages for data stored in memory cells of a semiconductor memory device.

SUMMARY

Aspects of the invention include methods for decoding information stored on a memory. The methods may include performing a hard read at an initial threshold and determining a first distribution percentage, performing a hard read at a subsequent threshold and determining a second distribution percentage, generating a log-likelihood ratio (LLR) based on the hard reads performed at the initial and subsequent thresholds, and based on the first and second distribution percentages, and soft decoding the information based on the generated LLR.

Further aspects of the invention include systems for decoding information stored on a memory. The systems may include a controller suitable for performing a hard read at an initial threshold and determining a first distribution percentage, performing a hard read at a subsequent threshold and determining a second distribution percentage, and generating a log-likelihood ratio (LLR) based on the hard reads performed at the initial and subsequent thresholds, and based on the first and second distribution percentages. The systems may include a decoder suitable for soft decoding the information based on the generated LLR.

Additional aspects of the invention include memory devices. The memory devices may include a controller configured to perform a hard read at an initial threshold and determine a first distribution percentage, perform a hard read at a subsequent threshold and determine a second distribution percentage, and generate a log-likelihood ratio (LLR) based on the hard reads performed at the initial and subsequent thresholds, and the first and second distribution percentages.

DETAILED DESCRIPTION

Figure 1:
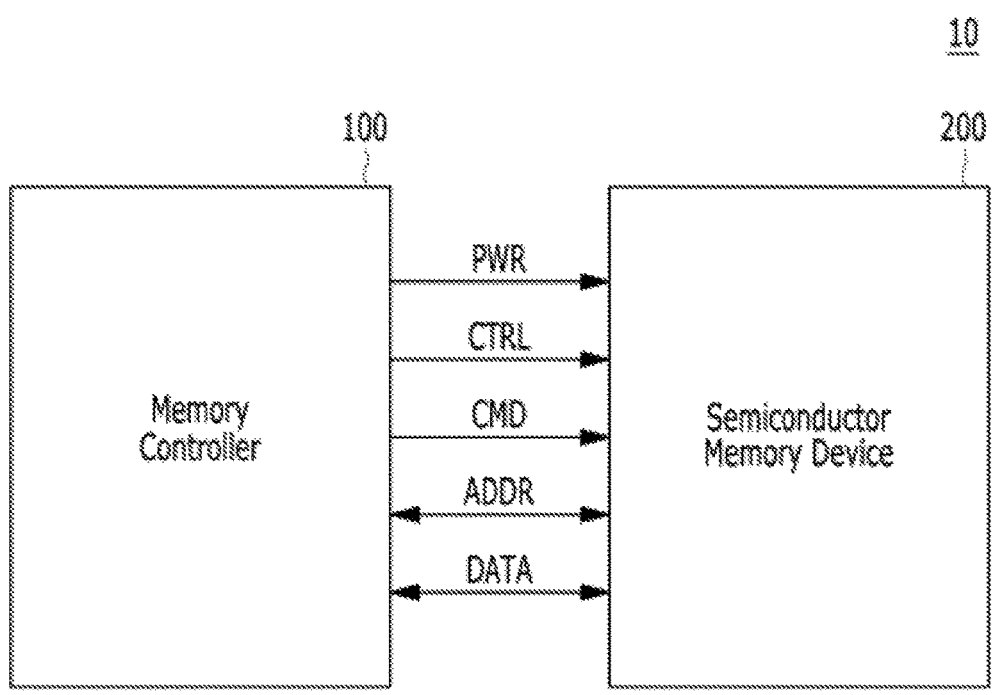
FIG. 1 is a block diagram schematically illustrating a memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

FIG. 1 is a block diagram schematically illustrating a memory system 10 in accordance with an embodiment of the present invention.

Referring FIG. 1, the memory system 10 may include a memory controller 100 and a semiconductor memory device 200.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 and the semiconductor memory device 200 may be integrated in a single semiconductor device. For example, the memory controller 100 and the semiconductor memory device 200 may be integrated in a single semiconductor device such as a solid state drive (SSD). The solid state drive may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system 10 may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 2:
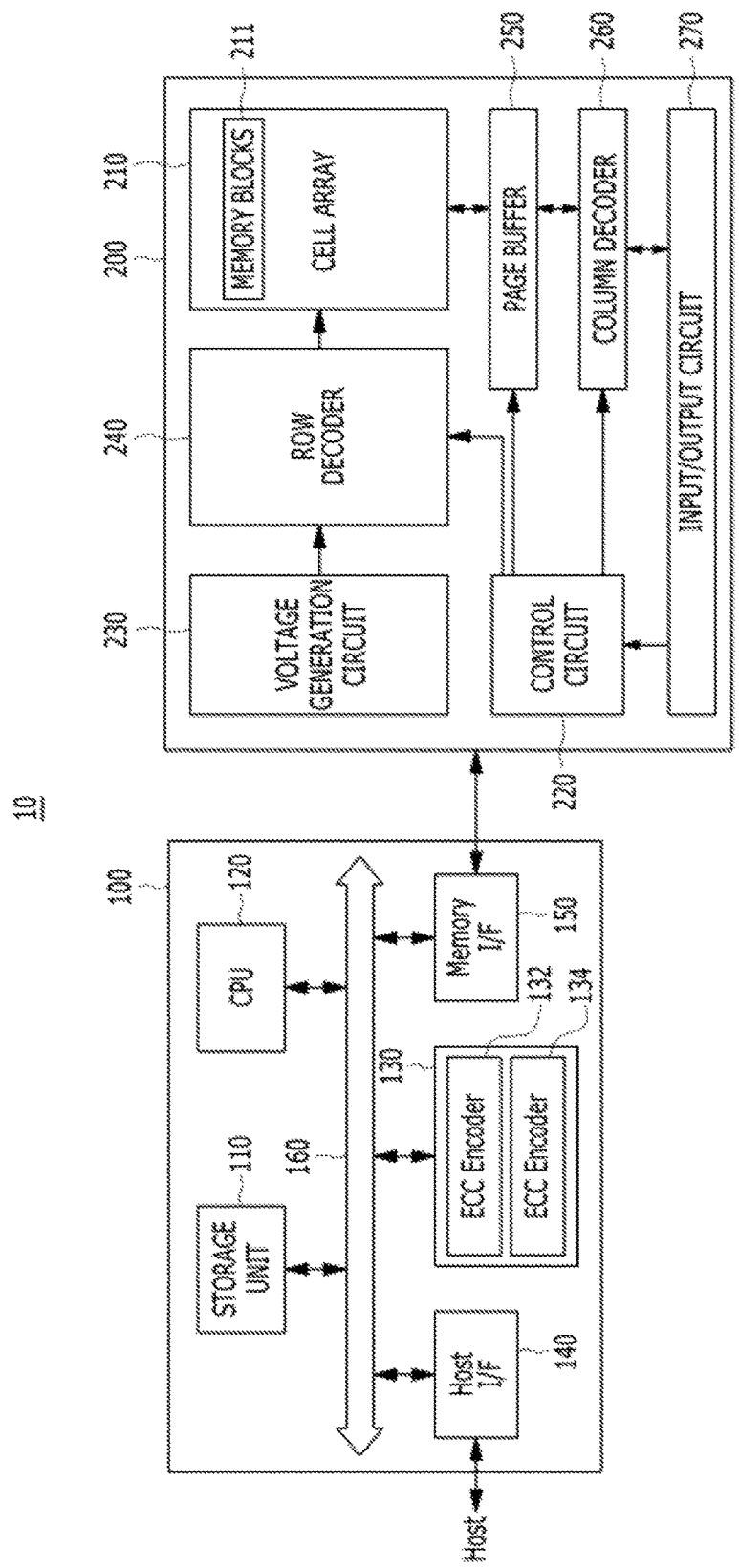
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may be the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The memory device 200 may store data to be accessed by the host device.

The memory device 200 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The controller 100 may control storage of data in the memory device 200. For example, the controller 100 may control the memory device 200 in response to a request from the host device. The controller 100 may provide the data read from the memory device 200, to the host device, and store the data provided from the host device into the memory device 200.

The controller 100 may include a storage unit 110, a central processing unit (CPU) 120, the error correction code (ECC) unit 130, a host interface 140 and a memory interface 150, which are coupled through a bus 160.

The storage unit 110 may serve as a working memory of the memory system 10 and the controller 100, and store data for driving the memory system 10 and the controller 100. When the controller 100 controls operations of the memory device 200, the storage unit 110 may store data used by the controller 100 and the memory device 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the memory device 200 for the read and write operations. To store the data, the storage unit 110 may include a program memory, a data memory, a write buffer, a read buffer, a map buffer, and so forth.

The CPU (or processor) 120 may control general operations of the memory system 10, and a write operation or a read operation for the memory device 200, in response to a write request or a read request from the host device. The CPU 120 may drive firmware, which is referred to as a flash translation layer (FTL), to control the general operations of the memory system 10. For example, the FTL may perform operations such as logical to physical (L2P) mapping, wear leveling, garbage collection, and bad block handling.

The ECC unit 130 may detect and correct errors in the data read from the memory device 200 during the read operation. The ECC unit 130 may not correct error bits when the number of the error bits is greater than or equal to a threshold number of correctable error bits, and may output an error correction fail signal indicating failure in correcting the error bits. The ECC unit 130 may include an ECC encoder 132 and an ECC decoder 134.

The ECC encoder 132 may perform error correction encoding on data to be programmed into the memory device 200 to output data to which parity bits are added. The parity bits may be stored in the memory device 200.

The ECC decoder 134 may perform error correction decoding on data read from the memory device 200. The ECC decoder 134 may determine whether the error correction decoding is successful, and may output an instruction signal based on the determination result. The ECC decoder 134 may correct error bits of data using parity bits generated by the ECC encoding.

In some embodiments, the ECC unit 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, a column decoder 260, and an Input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 is connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

Figure 3:
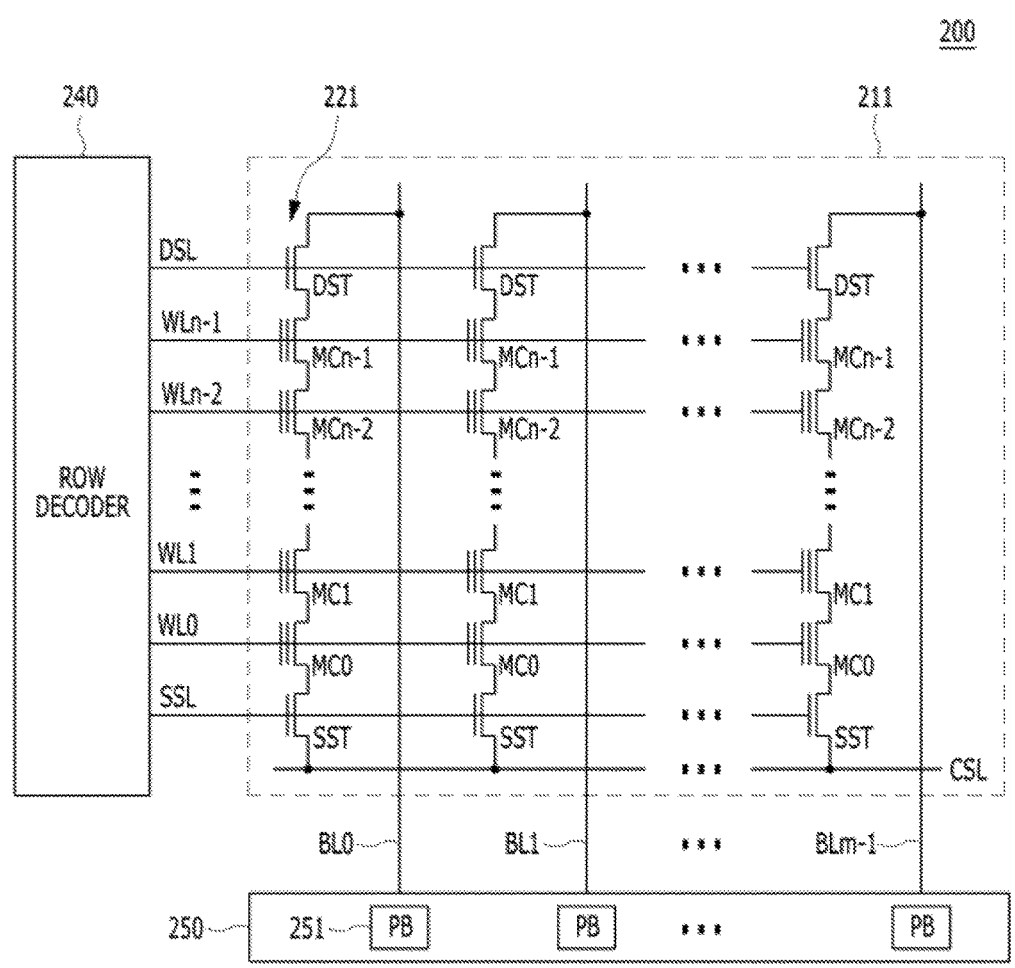
FIG. 3 is a circuit diagram illustrating a memory block of a semiconductor memory device in accordance with an embodiment of the present invention.

FIG. 3 is a circuit diagram illustrating a memory block of a semiconductor memory device in accordance with an embodiment of the present invention. For example, a memory block of FIG. 3 may be the memory blocks 211 of the memory cell array 200 shown in FIG. 2.

Referring to FIG. 3, the memory blocks 211 may include a plurality of cell strings 221 coupled to bit lines BL0 to BLm−1, respectively. The cell string of each column may include one or more drain selection transistors DST and one or more source selection transistors SST. A plurality of memory cells or memory cell transistors may be serially coupled between the selection transistors DST and SST. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

Information is stored in NAND flash memories by charging cells to a certain voltage. During reads, a predetermined threshold is used to compare to the cell voltage. If the cell voltage is lower than the threshold, the read result is 1, otherwise, the hard read result is 0. In the simplest case, the read back value (e.g., either 0 or 1) is solely based on whether the cell voltage is above or below a single threshold. Since the read back values are always binary with this read back mechanism, algebraic codes that use hard-decision decoding algorithms (e.g., BCH codes) are the natural choices for error correction.

However, as process geometry shrinks and more bits are stored into a cell, the endurance reliability of NAND flash memory has been significantly reduced. The endurance reliability may be roughly defined as the maximum number of times cells can be programmed and erased without exceeding a given error rate metric for a certain data retention period. This reduction in endurance reliability consequently has required the use of more powerful error correction codes, such as turbo codes and low-density-parity-check (LDPC) codes to prolong the usable lifespan of the cells.

To fully utilize the error correction capability of LDPC codes, the soft information, also called the log-likelihood ratio (LLR) should be calculated and fed into a decoder. How to calculate the soft LLR based on hard reads is critical to a NAND flash memory system. Disclosed herein are systems, methods and processes for LLR generation which can adapt to the cell level distribution and generate accurate LLRs for a soft decoder.

There are, among others, two large issues of current error recovery flow, particularly in steps related to LLR generation. The first issue is that the LLR generation does not adapt to the change of the cell voltage distribution. For example, cell voltage levels tend to shift toward a lower voltage after data retention. Some predetermined value may be assigned to cells whose voltage falls into a certain interval regardless of the underlying distribution ranges.

The second issue is that the error recovery flow is not efficient in the sense that many redundant reads are performed. For example, when a hard decoding falls, current error recovery algorithms attempt to use a different read threshold and perform another round of hard read and hard decoding. Preferably, a subsequent round of decoding should take some LLR value as an input, which is generated based on previous hard reads.

Thus, aspects of the invention are embodied in systems, methods, and processes for generating LLRs based on multiple rounds of hard reads without a priori information of the cell level distribution.

Referring to FIGS. 4-8, memory systems, methods, and processes for generating LLRs based on multiple rounds of hard reads are described in detail herein.

Generally, a hard read may be performed at an initial threshold and hard decoding may be performed. If the decoding fails, another hard read may be performed at a subsequent threshold. An LLR may then be generated based on the hard decodings at the initial and subsequent thresholds. The LLRs may be fed to a soft decoder. If the decoder still fails, additional hard reads may be performed at additional thresholds, and LLRs may be generated using the hard decodings at these thresholds. When performing more and more hard reads, each additional hard read results in a better estimation of the voltage distributions (using a is counter for example), and thus, better LLRs are generated. Accordingly, the soft decoder may decode the data much earlier than previously utilized error recovery flows.

Figure 4:
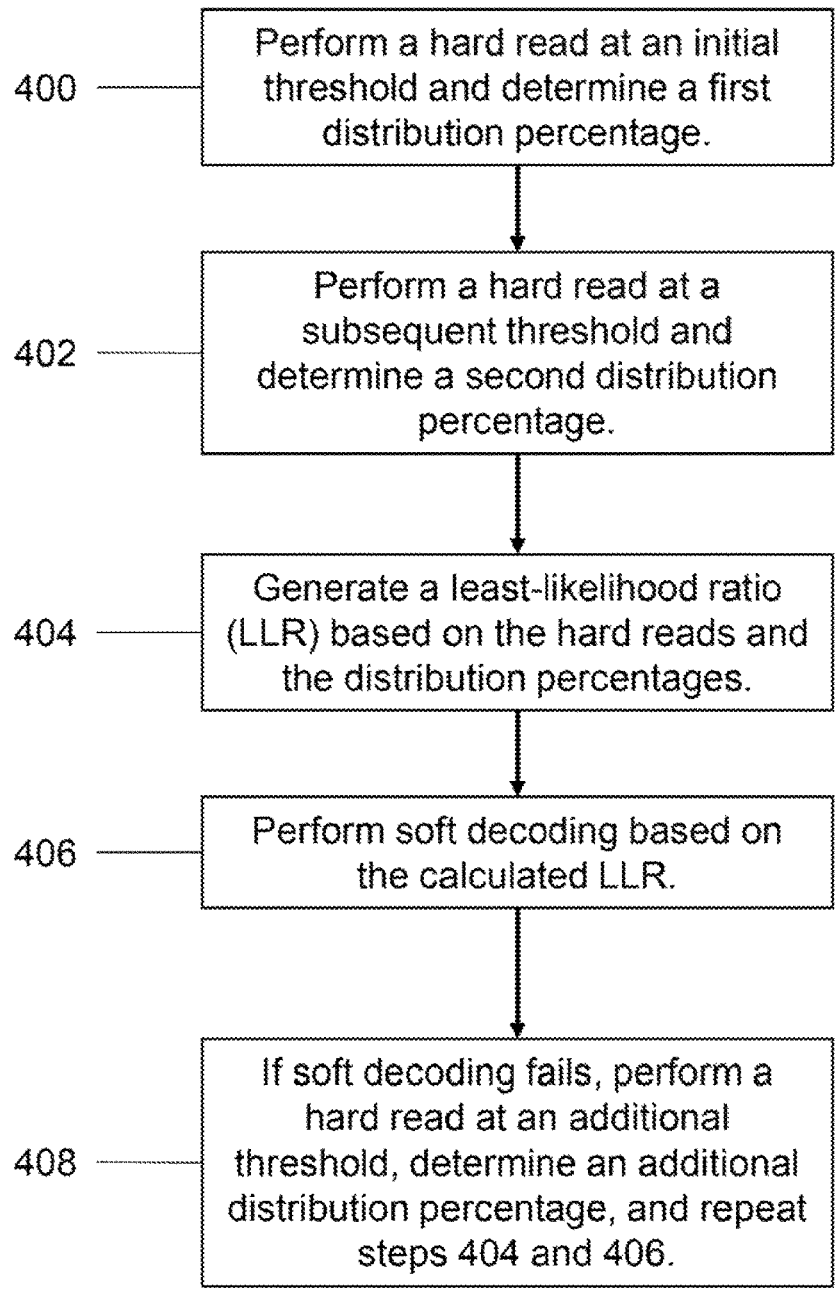
FIG. 4 is a flowchart of steps for generating LLRs based on multiple hard reads according to aspects of the invention.

Referring to FIG. 4, a flowchart 40 of steps for decoding with LLRs based on multiple hard reads is shown.

At step 400, a hard read is performed at an initial threshold and a first distribution percentage is determined. In an initial round of a hard read using threshold $t_1$, there is no knowledge of the underlying distributions. LLRs have not been generated at this point, so the LLRs may be simply represented as ±C, where the sign is determined by 0s and 1s of the hard reads. The distribution percentage is also determined. The distribution percentage may be the percentage of is in the first hard read, the percentage of 0s in the first hard read, and/or other distribution percentages of values returned by the hard read. In the examples described, the systems return binary (e.g., either 0 or 1) values, but this is merely exemplary and not exclusive, as those of skill in the art will understand additional systems with various values will benefit from the invention disclosed herein. In this example, the first distribution percentage is the percentage of is in the first hard read, and is labelled as $p_1$.

At step 402, a hard read is performed at a subsequent threshold and a second distribution percentage is determined. The subsequent threshold may be represented as threshold $t_2$ and the second distribution percentage may be represented as percentage $p_2$.

Figure 5:
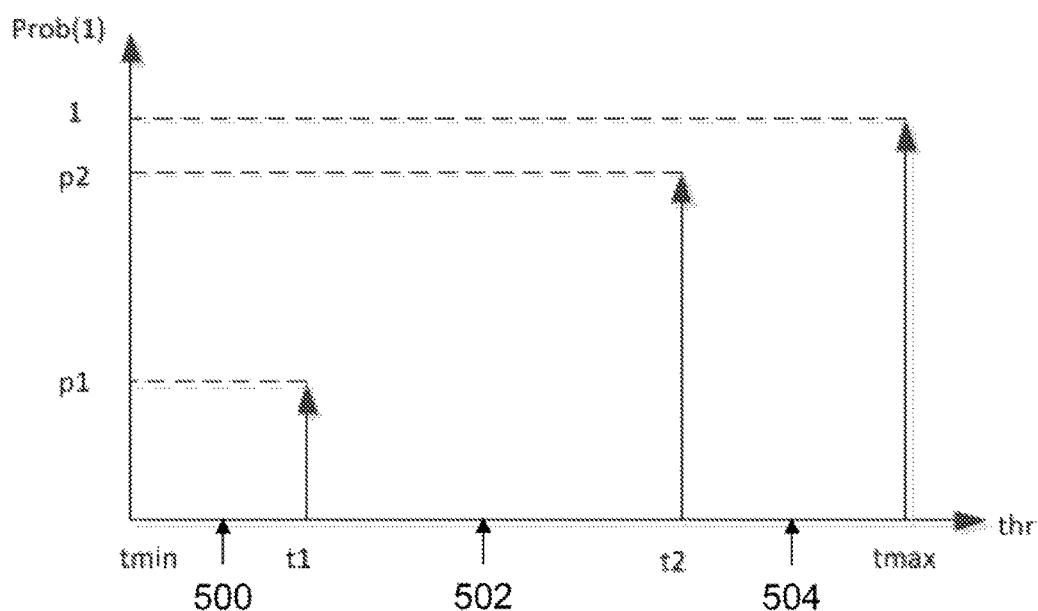
FIGS. 5, 6, and 7 are graphs showing examples of LLR generation in accordance with aspects of the invention.
Figure 6:
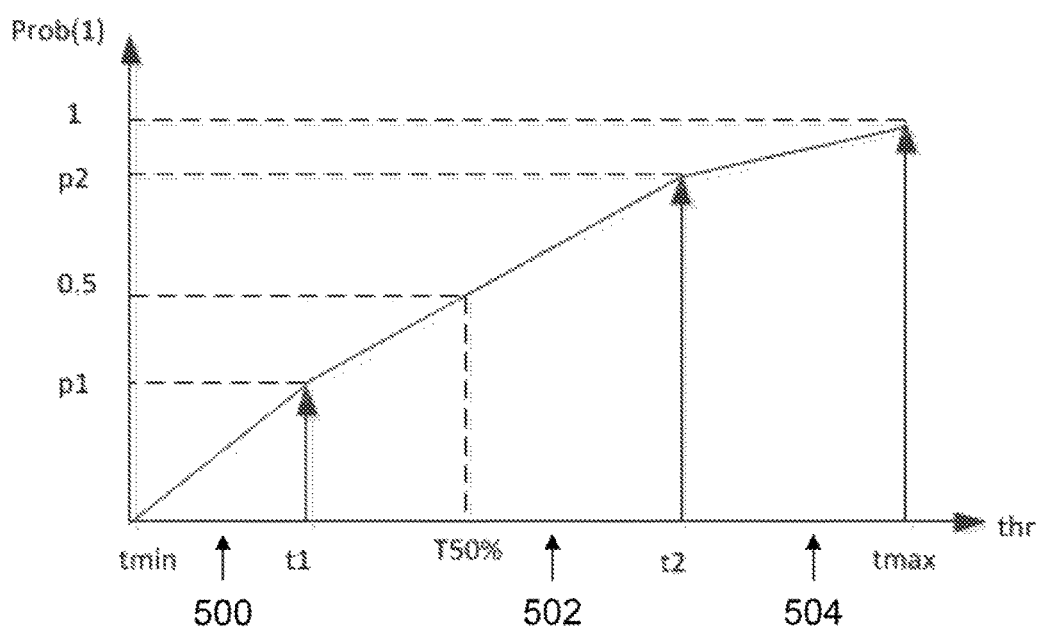
Figure 7:
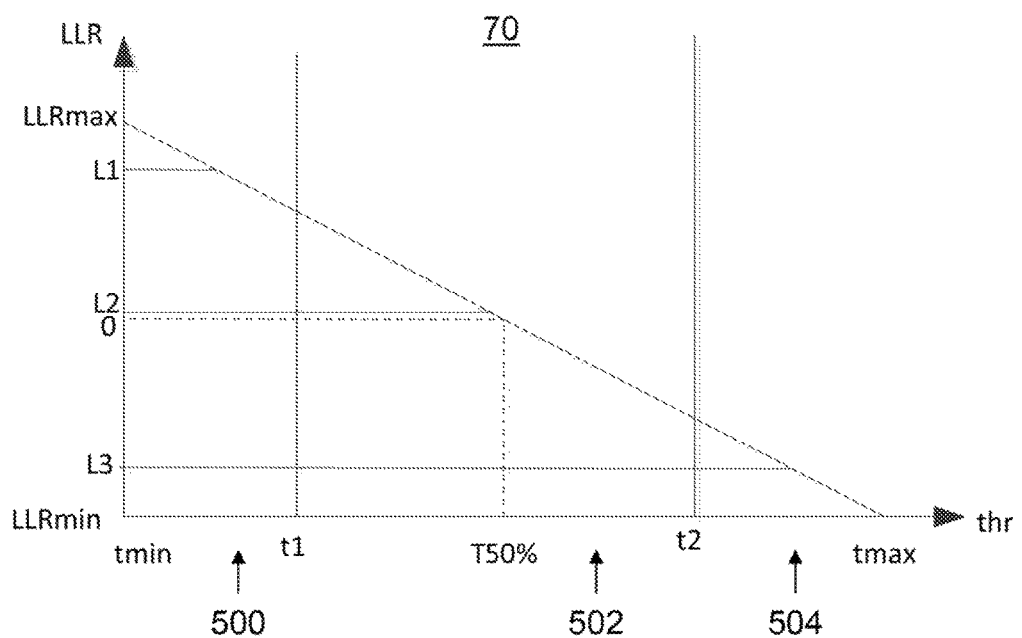

As can be seen in the graph 50 of FIG. 5, based on $p_1$ and $p_2$, a rough idea about the overall distribution becomes apparent, such that the area under the overall distribution in between $t_1$ and $t_2$ is $p_2-p_1$. The whole voltage range is divided into 3 parts: $(t_{min}, t_1)$ 500, $(t_1, t_2)$ 502 and $(t_2, t_{max})$ 504. A cell that falls into $(t_{min}, t_1)$ 500 will have [1, 1] as the hard read results, a cell that falls into $(t_1, t_2)$ 502 will have [0, 1] as hard reads, and a cell that falls into $(t_2, t_{max})$ 504 will have [0, 0] as the hard reads results. Only these three hard read results are valid, and [1, 0] is not valid. Sometimes [1, 0] may be hard read results due to read errors. In these instances, 0 may be assigned as the LLR value for this type of cells. The job of LLR generation is to assign an LLR value based on which interval a cell is falling into. This is true in this example, where $t_{min}<t_1<t_2<t_{max}$.

At step 404, the LLR is generated based on the hard reads and the distribution percentages. Referring to the graph 60 of FIG. 6, to calculate LLR value, $T_{50\%}$ may be estimated, which is the voltage level that is corresponding to about 50% of is in the hard read results. If scrambler works perfectly, $T_{50\%}$ may be used as the optimal hard read threshold for future hard reads.

Assuming the maximal value of LLR is $LLR_{max}$ and minimal value is $LLR_{min}$ (i.e., for a 4-bit LLR fixed point implementation, $LLR_{max}=7$ and $LLR_{min}=-7$), $LLR_{max}$ (or $LLR_{min}$) should be assigned to cell level $t_{min}$(or $t_{max}$). Cell level $T_{50\%}$ should be assigned with LLR value 0 such that a linear interpolation may be performed between $LLR_{max}$ and 0, and also $LLR_{min}$ and 0 (as shown in the graph 70 of FIG. 7). Then, the LLR value is generated for the middle point of each Interval 500, 502, 504, as the LLR value being assigned to cells falling into that interval. In the example shown in FIG. 7, $L_1$ will be assigned to cells which fall into $(t_{min}, t_1)$, $L_2$ will be assigned to cells which fall into $(t_1, t_2)$ and $L_3$ will be assigned to cells which fall into $(t_2, t_{max})$. In a fixed point system, quantization may be performed. The LLR is then generated according to the location of the cell level and the lookup value in $[L_1, L_2, L_3]$ and then fed into a soft decoder.

At step 406, soft decoding is performed based on the calculated LLRs. At step 408, if soft decoding fails, a hard read is performed at an additional threshold, an additional distribution percentage is determined, and steps 404 and 406 are repeated.

Thus, if the soft decoder fails, another round of hard reads using some other, additional read threshold around $T_{50\%}$ is performed. In an embodiment, $T_{50}\%$ is not used as the additional read threshold, because the amount of new information about true LLR, or the underlying distribution will be limited if all the hard read thresholds are concentrated around $T_{50\%}$. In an embodiment, the additional read thresholds are placed around $T_{50\%}$ with equal space in between neighboring thresholds.

Figure 8:
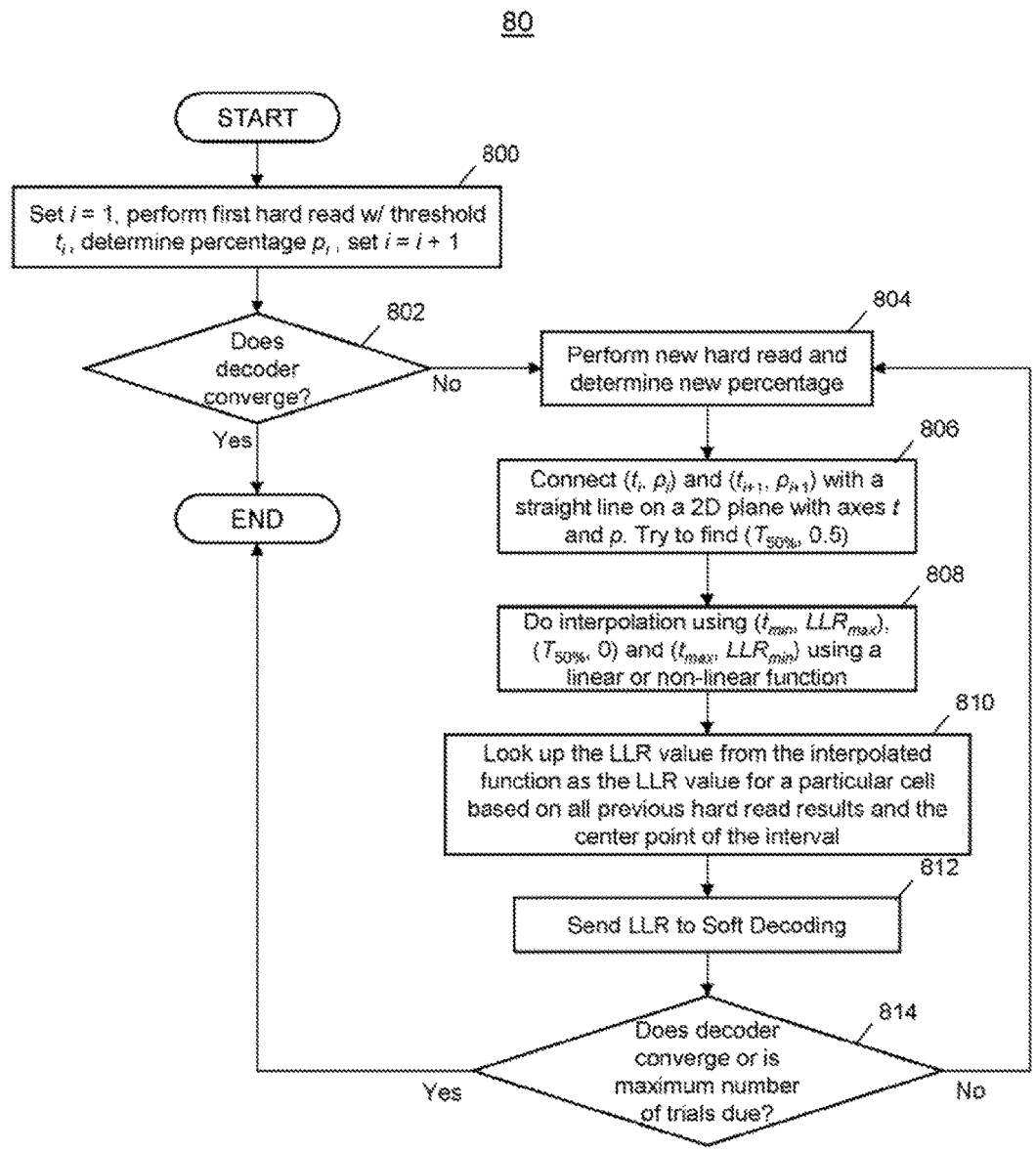
FIG. 8 is an algorithm with steps for generating LLRs based on multiple hard reads according to aspects of the invention.

Referring next to FIG. 8, an algorithm 80 for a controller is shown for generating LLRs based on multiple hard reads.

At block 800, set i=1. The first hard read is performed using threshold $t_i$. The distribution percentage of 1s is determined and is denoted as $p_i$. The hard read results are fed to a hard decoder. Then, set I=i+1.

At block 802, if the decoder converges, the algorithm terminates. If the decoder does not converge, the algorithm proceeds to block 804.

At block 804, a new hard read is performed at threshold $t_i$ and a new distribution percentage is determined and is denoted as $p_i$.

At block 806, connect $(t_i, p_i)$ and $(t_{i+1}, p_{i+1})$ with a straight line on a 2D plane with axes t and p. Try to find $(T_{50\%}, 0.5)$.

At block 808, do interpolation using $(t_{min}, LLR_{max})$, $(T_{50\%}, 0)$ and $(t_{max}, LLR_{min})$ using a linear or non-linear function.

At block 810, look up the LLR value from the interpolated function as the LLR value for a particular cell based on all previous hard read results and the center point of the interval.

At block 812, send LLR to the soft decoder for decoding.

At block 814, if the decoder converges or a maximum number of trials are due, the algorithm terminations. If the decoder does not converge and a maximum number of trials are not due, the controller loops back to block 804.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for decoding information stored on a memory, comprising:
   performing a first hard read of the information by using a first threshold and determining a first distribution percentage, which is a percentage of one of two symbols in the first hard read;
   performing a second hard read of the information by using a second threshold and determining a second distribution percentage, which is a percentage of the one symbol in the second hard read;
   generating a log-likelihood ratio (LLR) based on the first and second hard reads performed by using the first and second thresholds respectively, and based on the first and second distribution percentages, including estimating a voltage level corresponding to about 50% of the one symbol read in the first and second hard reads; and
   performing a first soft decoding of the information based on the generated LLR.

2. The method of claim 1, further comprising, if the first soft decoding fails:
   performing a third hard read of the information by using third threshold;
   determining a third distribution percentage;
   generating an additional LLR based on the third hard read and at least one of the first and second hard reads, and based on the third distribution percentage and at least one of the first and second distribution percentages; and
   performing a second soft decoding of the information based on the generated additional LLR.

3. The method of claim 1, wherein the one symbol is 1.

4. The method of claim 1, further comprising forming an interval using the first threshold and the second threshold.

5. The method of claim 4, wherein the generating of the LLR includes:
   finding an LLR value for a middle point of the interval; and
   assigning the found LLR value to memory cells in the interval, wherein the memory cells have hard reads of 0 in the first hard read using the first threshold and hard reads of 1 in the second hard read using the second threshold.

6. A system for decoding information stored on a memory, comprising:
   a semiconductor memory device;
   a controller coupled with the semiconductor memory device and configured to:
   perform a first hard read of the information by using a first threshold and determining a first distribution percentage, which is a percentage of one of two symbols in the first hard read;
   perform a second hard read of the information by using a second threshold and determining a second distribution percentage, which is a percentage of the one symbol in second hard read; and
   generate a log-likelihood ratio (LLR) based on the first and second hard reads performed by using the first and second thresholds respectively, and based on the first and second distribution percentages, including estimating a voltage level corresponding to about 50% of the one symbol read in the first and second hard reads; and
   a decoder configured to perform a first soft decoding of the information based on the generated LLR.

7. The system of claim 6, wherein the controller is further configured to, if first soft decoding fails:
   perform a third hard read of the information by using a third threshold;
   determine a third distribution percentage, and
   generate an additional LLR based on the third hard read and at least one of the first and second hard reads, and based on the third distribution percentage and at least one of the first and second distribution percentages.

8. The system of claim 6, wherein the one symbol is 1.

9. The system of claim 6, wherein the controller is further configured to form an interval using the first threshold and the second threshold.

10. The system of claim 9, wherein the controller is further configured to:
   find an LLR value for a middle point of the interval; and
   assign the found LLR value to memory cells in the interval, wherein the memory cells have hard reads of 0 in the first hard read using the first threshold and hard reads of 1 in the second hard read using the second threshold.

11. A memory device, comprising:
   a controller configured to:
   perform a first hard read of data by using a first threshold and determine a first distribution percentage, which is a percentage of a certain value in the first hard read;
   perform a second hard read of the data by using a second threshold and determine a second distribution percentage, which is percentage of a certain value in the second hard read; and
   generate a log-likelihood ratio (LLR) based on the first and second hard reads performed at the first and second thresholds respectively, and based on the first and second distribution percentages, including estimating a voltage level corresponding to about 50% of 1s read in the first and second hard reads.

12. The memory device of claim 11, further comprising:
   a decoder configured to perform a soft decode of the data based on the generated LLR.

13. The memory device of claim 12, wherein the controller is further configured to, if the soft decoding fails:

perform a third hard read of the data at third threshold;
determine a third distribution percentage; and
generate an additional LLR based on the third hard read and at least one of the first and second hard reads, and based on the third distribution percentage and at least one of the first and second distribution percentages.

14. The memory device of claim 11, wherein the one symbol is 1.

15. The memory device of claim 11, wherein the controller is further configured to form an interval using the first threshold and the second threshold.

16. The memory device of claim 15, wherein the controller is further configured to:
find an LLR value for a middle point of the interval; and
assign the found LLR value to memory cells in the interval, wherein the memory cells have hard reads of 0 in the first hard read using the first threshold and hard reads of 1 in the second hard read using the second threshold.

* * * * *